United States Patent
Yen et al.

(10) Patent No.: US 11,602,077 B2
(45) Date of Patent: Mar. 7, 2023

(54) HEAT DISSIPATION DEVICE WITH SORBENT MATERIAL IMMERSED IN LIQUID

(71) Applicant: GM Global Technology Operations LLC, Detroit, MI (US)

(72) Inventors: Chih-hung Yen, Bloomfield Hills, MI (US); Nicholas W. Pinto, Shelby Township, MI (US); Anne M. Dailly, West Bloomfield, MI (US); Nathan Thompson, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 300 days.

(21) Appl. No.: 17/152,184

(22) Filed: Jan. 19, 2021

(65) Prior Publication Data

US 2022/0232737 A1 Jul. 21, 2022

(51) Int. Cl.
*H05K 7/20* (2006.01)
*G06F 1/20* (2006.01)
*H01L 23/427* (2006.01)
*G08B 21/18* (2006.01)

(52) U.S. Cl.
CPC ......... *H05K 7/20363* (2013.01); *G06F 1/20* (2013.01); *G08B 21/182* (2013.01); *H01L 23/427* (2013.01); *H05K 7/20136* (2013.01)

(58) Field of Classification Search
CPC ......... H05K 7/20363; H05K 7/20136; H05K 7/20336; G06F 1/20; G06F 2200/201; G08B 21/182; H01L 23/427; H01L 23/467; F28D 15/0266

USPC ......................................................... 340/584
See application file for complete search history.

(56) References Cited

U.S. PATENT DOCUMENTS

| 4,759,191 | A | * | 7/1988 | Thomas | F25B 17/08 62/480 |
|---|---|---|---|---|---|
| 5,197,302 | A | * | 3/1993 | Sabin | F25D 5/00 62/477 |
| 5,477,706 | A | * | 12/1995 | Kirol | G06F 1/20 62/480 |
| 8,235,096 | B1 | * | 8/2012 | Mahefkey | H05K 7/20336 165/104.33 |
| 2011/0075360 | A1 | * | 3/2011 | Tomioka | H05K 7/20336 361/695 |
| 2012/0174793 | A1 | * | 7/2012 | Eisenberger | B01D 53/0407 96/145 |

(Continued)

*Primary Examiner* — Omar Casillashernandez
(74) *Attorney, Agent, or Firm* — Vivacqua Crane, PLLC (57) ABSTRACT

A heat dissipation device for an electronics cooling system having an electronic component includes a housing that defines a chamber. The device further includes a first liquid, which is contained within the chamber and has a first boiling temperature. The device further includes a sorbent material immersed within the first liquid. The device further includes a second liquid, which is adsorbed by the sorbent material and has a second boiling temperature that is above the first boiling temperature. The first liquid vaporizes into a first vapor, in response to the first liquid reaching the first boiling temperature. The second liquid is desorbed from the sorbent material, in response to the second liquid and the sorbent material reaching a desorption temperature that is below the second boiling temperature. The second liquid vaporizes into a second vapor, in response to the second liquid reaching the second boiling temperature.

20 Claims, 5 Drawing Sheets

(56) References Cited

U.S. PATENT DOCUMENTS

| | | | |
|---|---|---|---|
| 2021/0025657 A1* | 1/2021 | Lin | F28D 15/0275 |
| 2021/0372709 A1* | 12/2021 | Bandyopadhyay | F28D 15/04 |
| 2021/0385973 A1* | 12/2021 | Sologubenko | H05K 7/20336 |
| 2022/0159876 A1* | 5/2022 | Tung | H05K 7/20381 |
| 2022/0232737 A1* | 7/2022 | Yen | G08B 21/182 |

* cited by examiner

HEAT DISSIPATION DEVICE WITH SORBENT MATERIAL IMMERSED IN LIQUID

CROSS REFERENCE TO RELATED APPLICATION

The present application is related to application Ser. No. 17/152,178 concurrently filed herewith, and incorporated by reference herein.

INTRODUCTION

The present disclosure generally relates to electronics cooling, and more particularly relates to a heat dissipation device with multiple liquids and sorbent material immersed in one of the liquids to provide multiple stages of cooling.

Electronics can generate heat as a byproduct in response to the electronics receiving an electric current. The amount of heat depends on the power, device characteristics, and circuit design. The resistance of processors, driver circuits, power circuits, and memory contribute to some heat and power losses. To avoid failures or circuit malfunctions, electronics must operate and remain within safe working temperature limits. While some circuits will work without additional cooling, there are other circuits that include mechanisms for dissipating heat.

Existing heat pipes for electronics include an elongated tube containing a single liquid. The tube has a first end that transfers heat from an electronic component to the liquid, such that the liquid vaporizes into a vapor when the temperature of the liquid reaches its boiling temperature. The heat pipe further includes a second end that transfers heat from the vapor to the surrounding environment for condensing the vapor into the liquid when the temperature of the vapor falls below the boiling temperature. The heat pipe further includes a wick material interconnecting the first and second ends to return the condensed liquid from the second end to the first end. In a dry-out condition when the entire liquid vaporizes into a vapor, the vapor does not move toward the second end to cool, and condensate does not form and return to the first end, such that the ability of the heat pipe to cool the electronic component is adversely affected. In addition, existing heat pipes provide no warning to inform users that the temperature of the electronics is near or above a maximum safe working temperature.

Thus, while existing heat pipes achieve their intended purpose, there is a need for a new and improved heat dissipation device for electronics that addresses these issues.

SUMMARY

According to several aspects of the present disclosure, a heat dissipation device is provided for an electronics cooling system having an electronic component that generates heat in response to the electronic component receiving an electric current. The heat dissipation device includes a housing, which is attached to the electronic component and receives heat from the electronic component. The housing includes a surface that defines a chamber. The heat dissipation device further includes a first liquid that is contained within the chamber and receives heat from housing, with the first liquid having a first boiling temperature. The heat dissipation device further includes a sorbent material immersed within the first liquid. The heat dissipation device further includes a second liquid, which is adsorbed by the sorbent material and has a second boiling temperature that is above the first boiling temperature of the first liquid. The first liquid vaporizes into a first vapor, in response to the first liquid reaching the first boiling temperature. The second liquid is desorbed from the sorbent material, in response to the second liquid and the sorbent material reaching a desorption temperature that is below the second boiling temperature. The second liquid vaporizes into a second vapor, in response to the second liquid reaching the second boiling temperature.

In one aspect, the sorbent material is configured to desorb at least a portion of the second liquid into the chamber before all of the first liquid vaporizes into the first vapor.

In another aspect, the sorbent material is configured to desorb at least a portion of the second liquid into the chamber after all of the first liquid vaporizes into the first vapor.

In another aspect, the sorbent material is spaced from the surface of the housing and receives heat directly from the first liquid, in response to the sorbent material being immersed in the first liquid and a density of the first sorbent material being less than a density of the first liquid.

In another aspect, the sorbent material is supported directly by the surface of the housing and receives heat directly from the surface of the housing, in response to all of the first liquid vaporizing into the first vapor or a density of the first sorbent material being greater than a density of the first liquid.

In another aspect, the first liquid is water.

In another aspect, the second liquid is ethylene glycol.

According to several aspects of the present disclosure, an electronics cooling system includes an electronic component that generates heat, in response to the electronic component receiving an electric current. The system further includes a heat dissipation device for cooling the electronic component. The heat dissipation device includes a housing that is attached to the electronic component and receives heat from the electronic component, with the housing having a surface defining a chamber. The heat dissipation device further includes a first liquid that is contained within the chamber and receives heat from housing, with the first liquid having a first boiling temperature. The heat dissipation device further includes a first sorbent material immersed within the first liquid and a second sorbent material coated on the surface of the housing. The heat dissipation device further includes a second liquid adsorbed by at least one of the first and second sorbent materials and having a second boiling temperature that is above the first boiling temperature of the first liquid. The first liquid vaporizes into a first vapor, in response to the first liquid reaching the first boiling temperature. The second liquid is desorbed from at least one of the first and second sorbent materials, in response to the second liquid and at least one of the first and second sorbent materials reaching a desorption temperature. The desorption temperature is below the second boiling temperature. The second liquid vaporizes into a second vapor, in response to the second liquid reaching the second boiling temperature. The heat dissipation device further includes one or more thermocouples attached to at least one of the electronic component and the heat dissipation device. The thermocouples generate a first temperature signal associated with a temperature of the first liquid. The system further includes a controller electrically connected to the thermocouples, with the controller comparing the temperature of the first liquid to a first temperature threshold, in response to the controller receiving the first temperature signal from the thermocouples. The controller generates a first warning notification signal, in response to the controller determining that the temperature of the first liquid is above the first temperature threshold. The controller is electrically coupled to a display device for displaying a first warning indicative of the first liquid approaching the first temperature threshold, in response to the display device receiving the first warning notification signal from the controller.

In one aspect, at least one of the first and second sorbent materials is configured to desorb at least a portion of the second liquid into the chamber before all of the first liquid vaporizes into the first vapor.

In another aspect, at least one of the first and second sorbent materials is configured to desorb at least a portion of the second liquid into the chamber after all of the first liquid vaporizes into the first vapor.

In another aspect, the first sorbent material is spaced from the surface of the housing and receives heat directly from the first liquid and indirectly from the housing, in response to the second sorbent material being immersed in the first liquid and a density of the first sorbent material being less than a density of the first liquid.

In another aspect, the first sorbent material is supported directly by the surface of the housing and receives heat directly from the surface of the housing, in response to all of the first liquid vaporizing into a first vapor or a density of the first sorbent material being greater than a density of the first liquid.

In another aspect, the second sorbent material is coated onto a portion of the housing that is spaced from the electronic component, such that the second sorbent material receives heat indirectly from the electronic component. The second liquid is desorbed from the second sorbent material, in response to the second liquid and the second sorbent material reaching the desorption temperature that is above the first boiling temperature of the first liquid.

In another aspect, the thermocouple generates a second temperature signal associated with the temperature of the second liquid. The controller compares the temperature of the second liquid to a second temperature threshold, in response to the controller receiving the second temperature signal from the thermocouple. The controller generates a second warning notification signal, in response to the controller determining that the temperature of the second liquid is above a second temperature threshold. The display device displays a second warning indicative of the temperature of the second liquid approaching the second temperature threshold, in response to the display device receiving the second warning notification signal from the controller.

In another aspect, the electronics cooling system further includes a fan for generating a flow of air for cooling the housing and the first and second vapors within the housing.

In another aspect, the thermocouples includes a first thermocouple, which is attached to the electronic component and generates the first temperature signal, and a second thermocouple, which is attached to the heat dissipation device and generates the second temperature signal.

According to several aspects of the present disclosure, a method is provided for operating an electronics cooling system having an electronic component and a heat dissipation device attached to the electronic component. The heat dissipation device includes a housing attached to the electronic component and having a surface that defines a chamber. The heat dissipation device further includes a first liquid, which is contained within the chamber and has a first boiling temperature. The heat dissipation device further includes a first sorbent material immersed within the first liquid. The heat dissipation device further includes a second liquid, which is adsorbed by the first sorbent material and has a second boiling temperature that is above the first boiling temperature of the first liquid. The heat dissipation device further includes one or more thermocouples attached to one or more of the electronic components and a controller. The method includes transferring heat from the electronic component to the first liquid. The method further includes vaporizing the first liquid into a first vapor, in response to the first liquid receiving heat from the electronic component and the first liquid reaching the first boiling temperature. The method further includes desorbing the second liquid from the sorbent material, in response to the second liquid and the first sorbent material reaching a desorption temperature that is below the second boiling temperature. The method further includes vaporizing the second liquid into a second vapor, in response to the second liquid reaching the second boiling temperature.

In one aspect, the method further includes the step of desorbing, using the first sorbent material and a second sorbent material coated onto the housing, at least a portion of the second liquid into the chamber before all of the first liquid vaporizes into the first vapor.

In another aspect, the method further includes the step of receiving, by the first sorbent material that is spaced from the surface of the housing, heat directly from the first liquid, in response to the first sorbent material being immersed in the first liquid and a density of the first sorbent material being less than a density of the first liquid. At least a portion of the second liquid is desorbed from at least one of the first and second sorbent materials into the chamber after all of the first liquid vaporizes into the first vapor. The first sorbent material, which is supported directly by the surface of the housing, receives heat directly from the surface of the housing, in response to the first liquid vaporizing into a first vapor.

In another aspect, the method further includes the step of generating, using the thermocouple, a first temperature signal associated with a temperature of the first liquid. The controller compares the temperature of the first liquid to a first temperature threshold, in response to the controller receiving the first temperature signal from the thermocouple. The controller generates a first warning notification signal, in response to the controller determining that the temperature of the first liquid is above the first temperature threshold. A display device displays a first warning indicative of the first liquid approaching the first temperature threshold, in response to the display device receiving the first warning notification signal from the controller. The thermocouple generates a second temperature signal associated with a temperature of the second liquid. The controller compares the temperature of the second liquid to a second temperature threshold, in response to the controller receiving the second temperature signal from the thermocouple. The controller generates a second warning notification signal, in response to the controller determining that the temperature of the second liquid is above the second temperature threshold. The display device displays a second warning indicative of the temperature of the second liquid approaching the second temperature threshold, in response to the display device receiving the second warning notification signal from the controller.

Further areas of applicability will become apparent from the description provided herein. It should be understood that the description and specific examples are intended for purposes of illustration only and are not intended to limit the scope of the present disclosure.

DETAILED DESCRIPTION

The following description is merely exemplary in nature and is not intended to limit the present disclosure, application, or uses.

An exemplary electronics cooling system includes a heat dissipation device having a sorbent material to separate and recombine two or more liquids for cooling one or more electronic components. While the detailed examples described below are directed to a heat dissipation device with two liquids for providing a dual active thermal region of working temperatures, other examples can include more than two liquids to provide any range of working temperatures. More specifically, as described in the detailed examples below, the heat dissipation device includes a first liquid contained within a housing, a sorbent material immersed within the first liquid, and a second liquid adsorbed by the sorbent material. The second liquid can be desorbed from the sorbent material to prevent a dry-out condition when all the first liquid vaporizes into a first vapor, such that the second liquid prevents an associated interruption of cooling that can damage the electronic component. Put another way, the second liquid can be used as a buffer or backup when the first liquid has been fully vaporized. The first and second liquids provide a dual active thermal region (or a range of working temperatures) within which the heat dissipation device removes heat from the electronic component. The range of working temperatures can extend from the lowest freezing point of the two liquids to the highest boiling point of the two liquids. Within this range of working temperatures, the liquids receive heat from the electronic component, which in turn increases the temperature of the liquids.

The electronics cooling system can be an open loop passive system with a gravity-fed closed-ended vapor chamber or tube having a first closed end adjacent to the electronic component and a second closed end adjacent to a cooling fan. However, it is contemplated that other examples of the system can be a closed loop active system including a vapor chamber or tube that forms a loop with a pump pumping condensate through the loop to return to the electronic component.

The sorbent material can be disposed in any suitable position relative to the electronic components and form a layer having any suitable thickness to tune the heat dissipation device to provide an associated percentage of each liquid for cooling the electronic component. While only one liquid is adsorbed and desorbed from the sorbent material described below, the sorbent material can initially store any number of different liquids. These liquids can have associated boiling temperatures that are different from one another and be desorbed from the sorbent material at associated desorption temperatures. Furthermore, while the examples of first and second liquids described below are two different liquids with two different boiling temperatures, it is contemplated that the first and second liquids can be a common liquid with a common boiling temperature.

Figure 1:
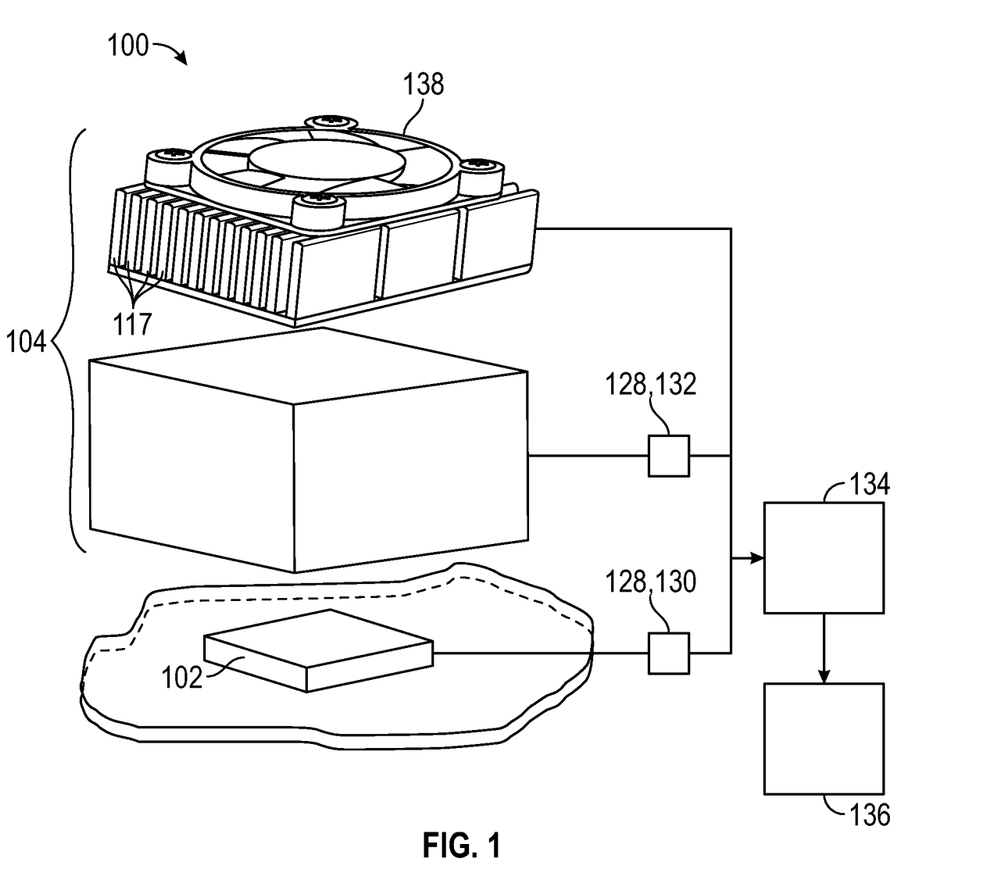
FIG. 1 is a perspective exploded view of one example of an electronics cooling system having an electronic component and a heat dissipation device for cooling the electronic component.
Figure 2:
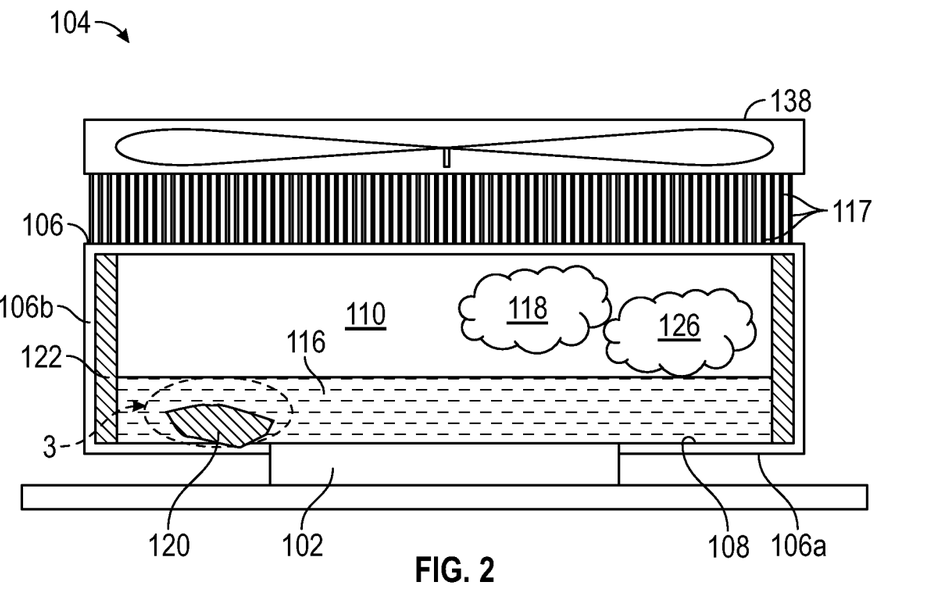
FIG. 2 is a cross-sectional view of the heat dissipation device of FIG. 1, as taken along line 2-2, illustrating the heat dissipation device having a housing defining a chamber, a first liquid contained within the chamber, and a sorbent material that is immersed in the first liquid.

Referring to FIGS. 1 and 2, one example of an electronics cooling system 100 includes an electronic component 102 that generates heat, in response to an electric current flowing through the electronic component 102. The electronic component can be a processor, driver circuits, power circuits, memory, or any other electronic component that generates heat, in response to the electronic component 102 receiving an electric current.

Figure 3:
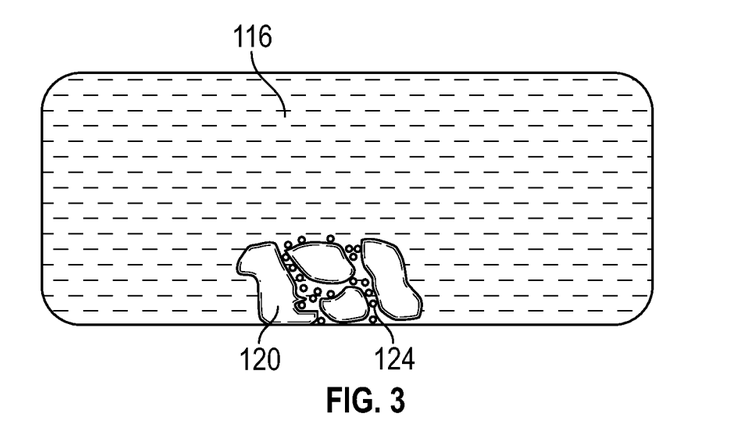
FIG. 3 is an enlarged view of the heat dissipation device of FIG. 2, within circle 3, illustrating a second liquid adsorbed by the sorbent material and a density of the sorbent material being greater than a density of the first liquid such that the sorbent material is supported directly by the housing before all the first liquid is vaporized into a first vapor.

As best shown in FIGS. 2 and 3, the system 100 further includes a heat dissipation device 104 for cooling the electronic component 102. In this non-limiting example, the heat dissipation device 104 can be a vapor chamber or a heat pipe for a passive open loop electronics cooling system. The heat dissipation device 104 includes a housing 106 having an inner surface 108 defining a chamber 110, with the housing 106 having first and second ends 112, 114 (FIG. 2) along the chamber 110. It is contemplated that other examples of the device can be a vapor chamber or a heat pipe for a closed loop active system with a pump pumping condensate through the loop to return to the electronic component.

The heat dissipation device 104 further includes a first liquid 116 contained within the chamber 110 of the housing 106 and receiving heat from the housing 106, with the first liquid 116 having a first boiling temperature. The first liquid 116 vaporizes into a first vapor 118, in response to the first liquid 116 reaching the first boiling temperature. In this example, the first liquid 116 is water having a freezing temperature of 32 degrees Fahrenheit and a boiling temperature of 212 degrees Fahrenheit at standard sea-level pressure. However, it is contemplated that the first liquid can be other liquids having associated freezing and boiling temperatures.

The heat dissipation device 104 further includes a first sorbent material 120 immersed within the first liquid 116. The first sorbent material 120 is suspended in the first liquid 116 and movable relative to the housing 106, such that the electronic component 102 transfers heat directly to the housing 106 that in turn transfers heat directly to the first liquid 116 that in turn transfers heat to the first sorbent material 120. In this example, the first sorbent material 120 has a density greater than the density of the first liquid, such that the first sorbent material 120 is immersed beneath a top surface of the first liquid 116 and supported by a bottom wall 106a of the housing 106. However, in other examples, the first sorbent material can have a density that is less than the density of the first liquid. The first sorbent material is selected from the group consisting of a zeolite, a silica gel, and a metal organic framework. However, in other examples, the first sorbent material can include other suitable materials for desorbing and adsorbing the liquid.

The heat dissipation device 104 further includes a second sorbent material 122 coated onto a sidewall 106b of the housing 106. In this example, the second sorbent material 122 is coated onto a portion of the housing 106 that is spaced from the electronic component 102, such that the second sorbent material 122 receives heat indirectly from the electronic component 102 via the bottom wall 106a and the sidewall 106b of the housing 106. It is contemplated that the sorbent material can be coated onto any portion of the inner surface. The sorbent material is selected from the group consisting of a zeolite, a silica gel, and a metal organic framework. However, in other examples, the sorbent material can include other suitable materials for desorbing and adsorbing the second liquid.

The heat dissipation device 104 further includes a second liquid 124, which is adsorbed by at least one of the first and second sorbent materials 120, 122 and has a second boiling temperature that is above the first boiling temperature of the first liquid 116. The second liquid 124 is desorbed from the second sorbent material 122, in response to the second liquid 1224 and the second sorbent material 122 reaching the desorption temperature. In this example, the desorption temperature is above the first boiling temperature of the first liquid 116. However, in other examples, the desorption temperature can be below the first boiling temperature of the first liquid. Furthermore, the second liquid 124 vaporizes into a second vapor 126, in response to the second liquid 124 reaching the second boiling temperature. In this example, the second liquid 124 is ethylene glycol having a freezing temperature of 8.78 degrees Fahrenheit and a boiling temperature of 386.6 degrees Fahrenheit at standard sea-level pressure. However, it is contemplated that the second liquid can be other liquids having associated freezing and boiling temperatures. In addition, it is contemplated that the heat dissipation device can include any number of sorbent materials disposed in other configurations for separating and recombining any number of liquids before other liquids are fully vaporized.

In operation, the first and second sorbent materials 120, 122 are desorb at least a portion of a second liquid 124 into the chamber 110 before all of the first liquid 116 vaporizes into a first vapor 118, such that the boiling temperature of the resultant mixture can depend on the concentration of the mixture as exemplified by the values in the table below.

| Weight % Ethylene Glycol | Boiling Point of Solution (deg F.) | Boiling Point of Solution (deg C.) |
|---|---|---|
| 0 | 212 | 100 |
| 10 | 215 | 102 |
| 20 | 215 | 102 |
| 30 | 220 | 104 |
| 40 | 220 | 104 |
| 50 | 225 | 107 |
| 60 | 230 | 110 |
| 70 | 240 | 116 |
| 80 | 255 | 124 |
| 90 | 285 | 134 |
| 100 | 387 | 197 |

The concentration or weight percentage of the solution can be controlled by at least one of: using predetermined liquids with associated boiling points, positioning sorbent materials holding those liquids at predetermined positions relative to the electronic components, and forming the sorbent material into layers of predetermined thicknesses. In another example, the first and second sorbent materials 120, 122 are configured to desorb the second liquid 124 into the chamber 110 after all of the first liquid 116 vaporizes into the first vapor 118.

Referring back to FIG. 1, the system 100 further includes one or more thermocouples 128 attached to at least one of the electronic component 102 and the heat dissipation device 104. The thermocouples 128 generate a first temperature signal associated with a temperature of the first liquid 116 and a second temperature signal associated with the temperature of the second liquid 124. More specifically, in this example, the thermocouples 128 include a first thermocouple 130 that is attached to the electronic component 102 and generates the first temperature signal. The thermocouples 128 further include a second thermocouple 132 that is attached to the heat dissipation device 104 and generates the second temperature signal. In other examples, the system includes a single thermocouple disposed within the chamber of the housing or disposed in any other location and attached to any portion of the heat dissipation device or the electronic component.

The system 100 further includes a controller 134 electrically connected to the thermocouples 128. The controller 134 compares the temperature of the first liquid 116 to a first temperature threshold, in response to the controller 134 receiving the first temperature signal from the thermocouple 128. In this example, the first temperature threshold is the first boiling temperature of the first liquid, such as 212 degrees Fahrenheit associated with water. The controller 134 generates a first warning notification signal, in response to the controller 134 determining that the temperature of the first liquid 116 is above the first temperature threshold. The controller 134 compares the temperature of the second liquid 124 to a second temperature threshold, in response to the controller 134 receiving the second temperature signal from the thermocouple 128. Continuing with the previous example, the second temperature threshold is the second boiling temperature of the second liquid 124, such as 387 degrees Fahrenheit associated with ethylene glycol. The controller 134 generates a second warning notification signal, in response to the controller 134 determining that the temperature of the second liquid 124 is above the second temperature threshold.

The controller 134 is further electrically coupled to a display device 136 for displaying a first warning indicative of the first liquid 116 approaching the first temperature threshold, in response to the display device 136 receiving the first warning notification signal from the controller 134. The display device 136 further displays a second warning indicative of the temperature of the second liquid 124 approaching the second temperature threshold, in response to the display device 136 receiving the second warning notification signal from the controller 134.

The system 100 further includes a fan 138 that generates a flow of air over the second end 114 of the housing 106 and the fins 117 (FIG. 2) extending from the housing 106 to dissipate heat from the same.

Figure 4:
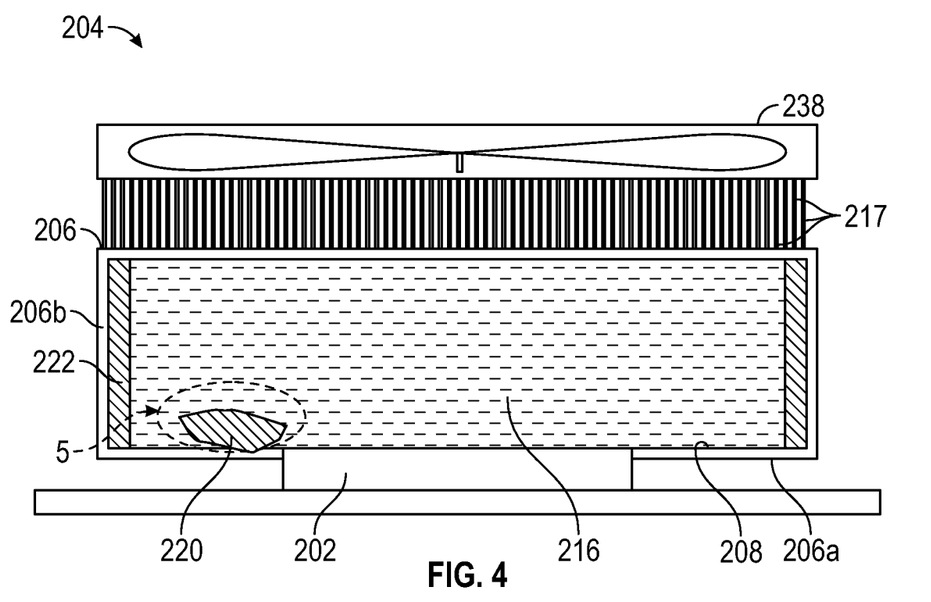
FIG. 4 is a cross-sectional view of another example of the electronics cooling system of FIG. 1, as taken along line 2-2, illustrating the heat dissipation device having a housing defining a chamber, a first liquid contained within the chamber, and a sorbent material that is immersed in the first liquid.
Figure 5:
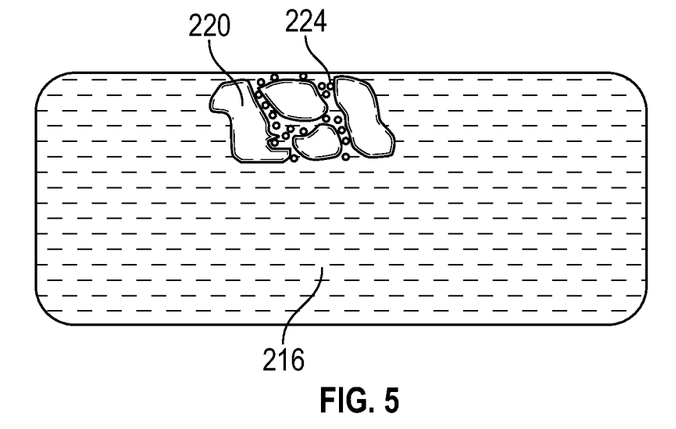
FIG. 5 is an enlarged view of the heat dissipation device of FIG. 4, within circle 5, illustrating a second liquid adsorbed by the sorbent material with the sorbent material spaced from the housing before all the first liquid is vaporized into a first vapor.

Referring to FIGS. 4 and 5, another example of a heat dissipation device 204 is similar to the heat dissipation device 104 of FIGS. 2 and 3 and includes the same components identified by the same reference numbers increased by 100. While the first sorbent material 120 of FIG. 3 has a density greater than the density of the first liquid 116 such that the first sorbent material 120 is immersed beneath the top surface of the first liquid 116, the first sorbent material 220 has a density that is less than the density of the first liquid 216 such that the first sorbent material 220 is sufficiently buoyant to float to the top surface of the first liquid 216. For that reason, the first sorbent material 220 is spaced from the bottom wall 206a of the housing 206 and receives heat directly from the first liquid 216 and indirectly from the housing 206, in response to the first sorbent material 220 being immersed in the first liquid 216. More specifically, the electronic component transfers heat to the housing 206 that in turn transfers heat to the first liquid 216 that in turn transfers heat to the first sorbent material 220 and second liquid 224 adsorbed therein.

Figure 6:
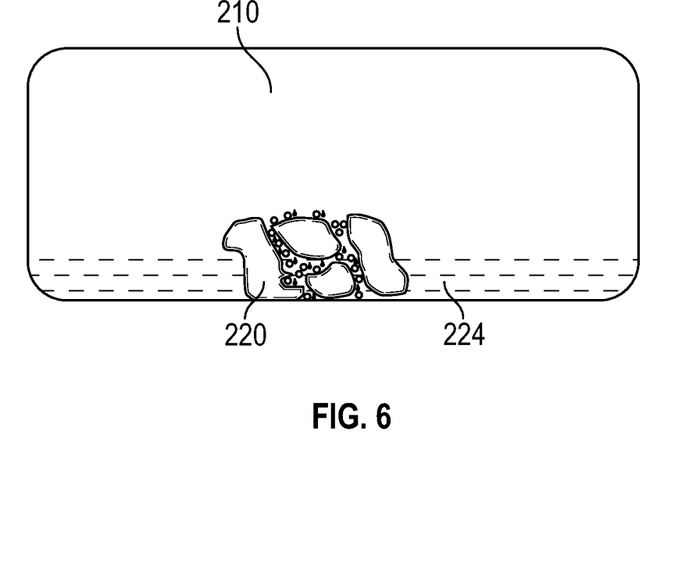
FIG. 6 is an enlarged view of the heat dissipation device of FIG. 5, illustrating a second liquid desorbed from the sorbent material with the sorbent material being supported directly by the housing after all the first liquid is vaporized into the first vapor.

Referring now to FIG. 6, the first sorbent material 220 is supported directly by the surface 208 of the housing 206 and receives heat directly from the surface 208 of the housing 206, in response to the first liquid 216 vaporizing into the first vapor 218.

Figure 7:
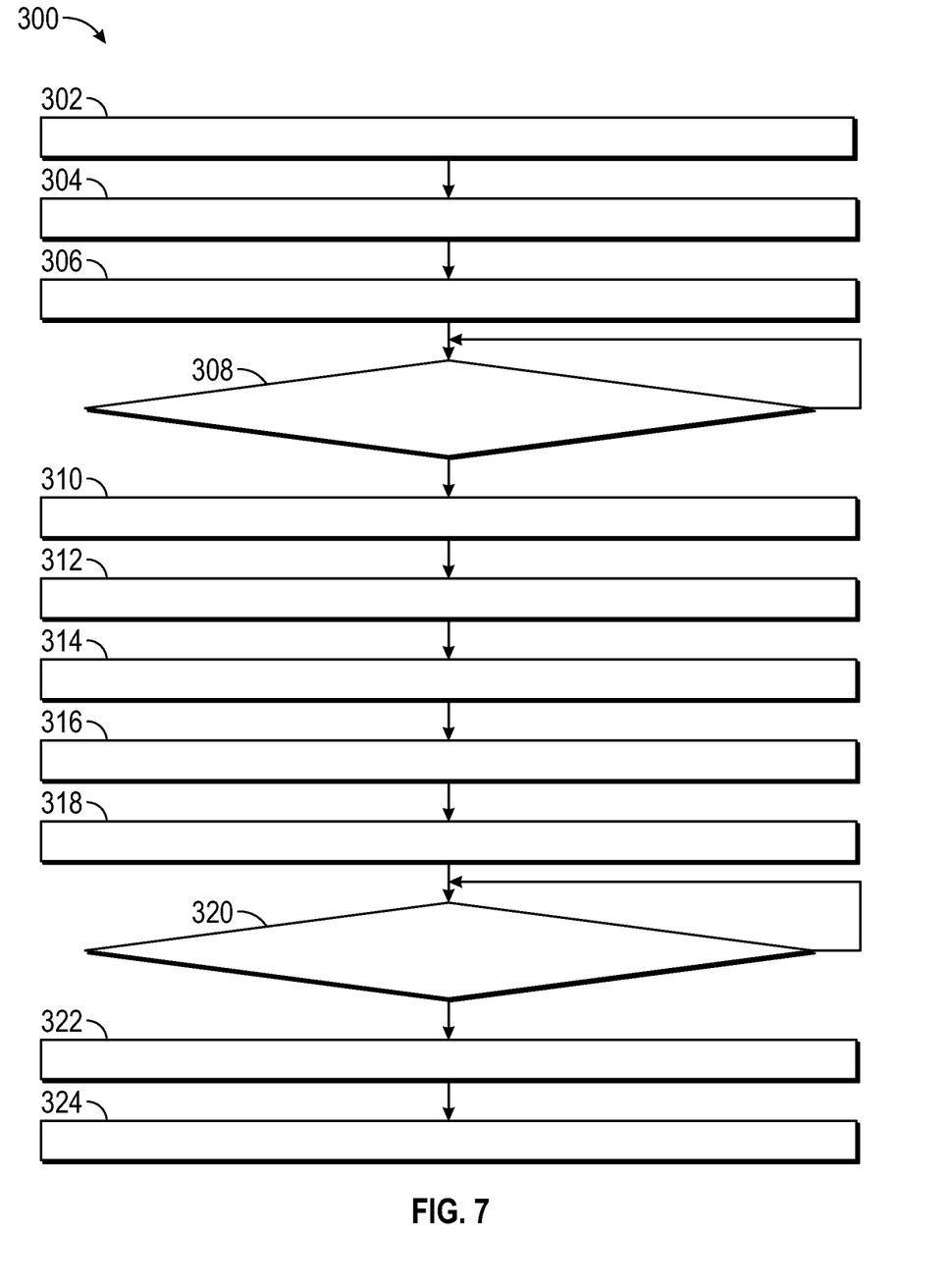
FIG. 7 is a flow chart of one example of a method of operating the electronics cooling system of FIG. 1.

Referring to FIG. 7, a method 300 of operating the system 100 of FIG. 2 is provided. The method 300 begins at block 302 with the electronic component 102 generating heat, in response to the electronic component 102 receiving an electrical current. More specifically, in this example (FIGS. 1-3), the electronic component 102 transfers heat to the bottom wall 106a of the housing 106, which in turn transfers heat to the first liquid 116, and the first liquid 116 transfers heat to the first sorbent material 120 and the first liquid 116 adsorbed therein. Furthermore, the first sorbent material 120 has a density that is greater than the density of the first liquid 116, such that the first sorbent material 120 is immersed beneath the top surface of the first liquid 116 and supported directly by the bottom wall 106a of the housing 106. Accordingly, a portion of the heat is transferred from the housing 106 directly to the portion of the first sorbent material 120 that is supported directly by a bottom wall 106a of the housing 106.

In another example (FIGS. 4-6), the first sorbent material 220 has a density that is less than the density of the first liquid 216, such that the first sorbent material 220 floats to the top surface of the first liquid 216 and is spaced from the housing 206 (FIG. 5) before all the first liquid 216 vaporizes into the first vapor 218. All heat transfers from the housing 206 to the first liquid 216, that in turn transfers heat to the first sorbent material 220. It is contemplated that the location of the second sorbent layer on the housing, the thickness of the second sorbent layer, the density of the first sorbent layer, and all other structures forming heat paths to the sorbent layers and liquids adsorbed therein can be tuned for controlling the rate of heat flow to the same.

At block 304, the first liquid 116 vaporizes into the first vapor 118, in response to the first liquid 116 receiving heat from the electronic component 102 and the first liquid 116 reaching the first boiling temperature.

At block 306, the first thermocouple 130 generates a first temperature signal associated with a temperature of the first liquid.

At block 308, the controller 134 compares the temperature of the first liquid 116 to a first temperature threshold, in response to the controller receiving the first temperature signal from the first thermocouple 130. In this example, the first temperature threshold is the first boiling temperature of the first liquid. However, it is contemplated that the first temperature threshold can be above or below the first boiling temperature. For instance, to provide additional warning of the first liquid 116 drying out, the first temperature threshold can be a temperature that is below the first boiling temperature of the first liquid 116. If the temperature of the first liquid 116 is below the first temperature threshold, the method repeats block 308. If the temperature of the first liquid 116 is above the first temperature threshold, the method 300 proceeds to block 310.

At block 310, the controller 134 generates a first warning notification signal, in response to the controller 134 determining that the temperature of the first liquid 116 is above the first temperature threshold.

At block 312, a display device 136 displays a first warning indicative of the first liquid 116 approaching the first temperature threshold, in response to the display device receiving the first warning notification signal from the controller 134.

At block 314, at least a portion of the second liquid 124 is desorbed from at least one of the first and second sorbent materials 120, 122 and released into the chamber 110, in response to the second liquid 124 and the first and second sorbent materials 120, 122 reaching the desorption temperature. The desorption temperature is below the second boiling temperature. In one example, the desorption temperature is also below the first boiling temperature of the first liquid 116 that is in turn below the second boiling temperature of the second liquid 124, such that at least a portion of the second liquid 124 is desorbed from the first and second sorbent materials 120, 122 before all of the first liquid 116 vaporizes into the first vapor 118. In another example, the desorption temperature is above the first boiling temperature of the first liquid 116 and below the second boiling temperature of the second liquid 124, such that at least a portion of the second liquid 124 is desorbed from the first and second sorbent materials 120, 122 after all of the first liquid 116 vaporizes into the first vapor 118.

At block 316, the second liquid 124 vaporizes into the second vapor 126, in response to the second liquid 124 receiving heat from the electronic component and the second liquid 124 reaching the second boiling temperature.

At block 318, the second thermocouple 132 generates a second temperature signal associated with a temperature of the second liquid 124.

At block 320, the controller 134 compares the temperature of the second liquid 124 to a second temperature threshold, in response to the controller 134 receiving the second temperature signal from the second thermocouple 132. In this example, the second temperature threshold is the second boiling temperature. However, it is contemplated that the second temperature threshold can be above or below the second boiling temperature. For instance, to provide additional warning of the second liquid 124 drying out, the second temperature threshold can be below the second boiling temperature of the second liquid 124. If the temperature of the second liquid 124 is below the second temperature threshold, the method 300 repeats block 320. If the temperature of the second liquid 124 is above the second temperature threshold, the method proceeds to block 322.

At block 322, the controller 134 generates a second warning notification signal, in response to the controller 134 determining that the temperature of the second liquid 124 is above the second temperature threshold.

At block 324, the display device 136 displays a second warning indicative of the temperature of the second liquid approaching the second temperature threshold, in response to the display device receiving the second warning notification signal from the controller 134.

The description of the present disclosure is merely exemplary in nature and variations that do not depart from the general sense of the present disclosure are intended to be within the scope of the present disclosure. Such variations are not to be regarded as a departure from the spirit and scope of the present disclosure.

What is claimed is:

1. A heat dissipation device for an electronics cooling system having an electronic component that generates heat in response to receiving an electric current, the heat dissipation device comprising:
   a housing attached to the electronic component and receiving heat from the electronic component, with the housing having a surface defining a chamber;
   a first liquid contained within the chamber of the housing and receiving heat from housing, with the first liquid having a first boiling temperature;
   a sorbent material immersed within the first liquid; and
   a second liquid adsorbed by the sorbent material and having a second boiling temperature that is above the first boiling temperature of the first liquid;
   wherein the first liquid vaporizes into a first vapor in response to the first liquid reaching the first boiling temperature;
   wherein the second liquid is desorbed from the sorbent material in response to the second liquid and the sorbent material reaching a desorption temperature that is below the second boiling temperature, and the second liquid vaporizes into a second vapor in response to the second liquid reaching the second boiling temperature.

2. The heat dissipation device of claim 1 wherein the sorbent material is configured to desorb at least a portion of the second liquid into the chamber before all of the first liquid vaporizes into the first vapor.

3. The heat dissipation device of claim 1 wherein the sorbent material is configured to desorb at least a portion of the second liquid into the chamber after all of the first liquid vaporizes into the first vapor.

4. The heat dissipation device of claim 3 wherein the sorbent material is spaced from the surface of the housing and receives heat directly from the first liquid and indirectly from the housing in response to the sorbent material being immersed in the first liquid.

5. The heat dissipation device of claim 4 wherein the sorbent material is supported directly by the surface of the housing and receives heat directly from the surface of the housing in response to the first liquid vaporizing into the first vapor.

6. The heat dissipation device of claim 5 wherein the first liquid is water.

7. The heat dissipation device of claim 6 wherein the second liquid is ethylene glycol.

8. An electronics cooling system comprising:
   an electronic component that generates heat in response to receiving an electric current;
   a heat dissipation device for cooling the electronic component, the heat dissipation device comprising:
      a housing attached to the electronic component and receiving heat from the electronic component, with the housing having a surface defining a chamber;
      a first liquid contained within the chamber of the housing and receiving heat from housing, with the first liquid having a first boiling temperature;
      a first sorbent material immersed within the first liquid;
      a second sorbent material coated on the surface of the housing; and
      a second liquid adsorbed by at least one of the first and second sorbent materials and having a second boiling temperature that is above the first boiling temperature of the first liquid;
      wherein the first liquid vaporizes into a first vapor in response to the first liquid reaching the first boiling temperature;
      wherein the second liquid is desorbed from at least one of the first and second sorbent materials in response to the second liquid and in further response to at least one of the first and second sorbent materials reaching a desorption temperature that is below the second boiling temperature, and the second liquid vaporizes into a second vapor in response to the second liquid reaching the second boiling temperature;
   at least one thermocouple attached to at least one of the electronic component and the heat dissipation device, with the at least one thermocouple generating a first temperature signal associated with a temperature of the first liquid;
   a controller electrically connected to the at least one thermocouple, with the controller comparing the temperature of the first liquid to a first temperature threshold in response to the controller receiving the first temperature signal from the at least one thermocouple, and the controller generating a first warning notification signal in response to the controller determining that the temperature of the first liquid is above the first temperature threshold;
   wherein the controller is electrically coupled to a display device for displaying a first warning indicative of the first liquid approaching the first temperature threshold in response to the display device receiving the first warning notification signal from the controller.

9. The electronics cooling system of claim 8 wherein at least one of the first and second sorbent materials is configured to desorb at least a portion of the second liquid into the chamber before all of the first liquid vaporizes into the first vapor.

10. The electronics cooling system of claim 8 wherein at least one of the first and second sorbent materials is configured to desorb at least a portion of the second liquid into the chamber after all of the first liquid vaporizes into the first vapor.

11. The electronics cooling system of claim 10 wherein the first sorbent material is spaced from the surface of the housing and receives heat directly from the first liquid and indirectly from the housing in response to the first sorbent material being immersed in the first liquid.

12. The electronics cooling system of claim 11 wherein the first sorbent material is supported directly by the surface of the housing and receives heat directly from the surface of the housing in response to the first liquid vaporizing into a first vapor.

13. The electronics cooling system of claim 12 wherein the second sorbent material is coated onto a portion of the housing that is spaced from the electronic component such that the second sorbent material receives heat indirectly from the electronic component and the second liquid is desorbed from the second sorbent material in response to the second liquid and the second sorbent material reaching the desorption temperature that is above the first boiling temperature of the first liquid.

14. The electronics cooling system of claim 13 wherein the at least one thermocouple generates a second temperature signal associated with the temperature of the second liquid;
- wherein the controller compares the temperature of the second liquid to a second temperature threshold in response to the controller receiving the second temperature signal from the at least one thermocouple;
- wherein the controller generates a second warning notification signal in response to the controller determining that the temperature of the second liquid is above a second temperature threshold; and
- wherein the display device displays a second warning indicative of the temperature of the second liquid approaching the second temperature threshold in response to the display device receiving the second warning notification signal from the controller.

15. The electronics cooling system of claim 14 further comprising a fan generating a flow of air for cooling the housing and the first and second vapors within the housing.

16. The electronics cooling system of claim 15 wherein the at least one thermocouple comprises:
- a first thermocouple attached to the electronic component and generating the first temperature signal; and
- a second thermocouple attached to the heat dissipation device and generating the second temperature signal.

17. A method of operating an electronics cooling system having an electronic component and a heat dissipation device attached to the electronic component, with the heat dissipation device including a housing attached to the electronic component and having a surface defining a chamber, a first liquid contained within the chamber and having a first boiling temperature, a first sorbent material immersed within the first liquid, a second liquid adsorbed by at least the first sorbent material and having a second boiling temperature that is above the first boiling temperature of the first liquid, at least one thermocouple attached to at least one of the electronic component and the heat dissipation device, and a controller, the method comprising:
- transferring heat from the electronic component to the first liquid;
- vaporizing the first liquid into a first vapor in response to the first liquid receiving heat from the electronic component and the first liquid reaching the first boiling temperature;
- desorbing the second liquid from the first sorbent material in response to the second liquid and at least the first sorbent material reaching a desorption temperature that is below the second boiling temperature; and
- vaporizing the second liquid into a second vapor in response to the second liquid reaching the second boiling temperature.

18. The method of claim 17 further comprising desorbing, using the first sorbent material and a second sorbent material coated onto the housing, at least a portion of the second liquid into the chamber before all of the first liquid vaporizes into the first vapor.

19. The method of claim 18 further comprising:
- receiving, by the first sorbent material spaced from the surface of the housing, heat directly from the first liquid in response to the first sorbent material being immersed in the first liquid;
- desorbing, using at least one of the first and second sorbent materials, at least a portion of the second liquid into the chamber after all of the first liquid vaporizes into the first vapor; and
- receiving, by the first sorbent material supported directly by the surface of the housing, heat directly from the surface of the housing in response to the first liquid vaporizing into a first vapor.

20. The method of claim 19 further comprising:
- generating, using the at least one thermocouple, a first temperature signal associated with a temperature of the first liquid;
- comparing, using the controller, the temperature of the first liquid to a first temperature threshold in response to the controller receiving the first temperature signal from the at least one thermocouple;
- generating, using the controller, a first warning notification signal in response to the controller determining that the temperature of the first liquid is above the first temperature threshold;
- displaying, using a display device, a first warning indicative of the first liquid approaching the first temperature threshold in response to the display device receiving the first warning notification signal from the controller;
- generating, using the at least one thermocouple, a second temperature signal associated with a temperature of the second liquid;
- comparing, using the controller, the temperature of the second liquid to a second temperature threshold in response to the controller receiving the second temperature signal from the at least one thermocouple;
- generating, using the controller, a second warning notification signal in response to the controller determining that the temperature of the second liquid is above the second temperature threshold;
- displaying, using the display device, a second warning indicative of the temperature of the second liquid approaching the second temperature threshold in response to the display device receiving the second warning notification signal from the controller.

\* \* \* \* \*